United States Patent
Ma

(10) Patent No.: US 6,752,636 B2
(45) Date of Patent: Jun. 22, 2004

(54) RETAINER DEVICE FOR ELECTRONIC PACKAGE

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/321,335

(22) Filed: Dec. 16, 2002

(65) Prior Publication Data

US 2004/0018755 A1 Jan. 29, 2004

(30) Foreign Application Priority Data

Jul. 26, 2002 (TW) .................................... 091211448 U

(51) Int. Cl.⁷ ................................................. H01R 4/58
(52) U.S. Cl. ....................................................... 439/73
(58) Field of Search .............................. 439/73, 72, 71, 439/487

(56) References Cited

U.S. PATENT DOCUMENTS 5,100,333 A * 3/1992 Suzuki ........................ 439/73
5,485,351 A * 1/1996 Hopfer et al. ............... 361/704
5,807,104 A * 9/1998 Ikeya et al. .................... 439/73

\* cited by examiner

Primary Examiner—Renee Luebke
Assistant Examiner—Ann McCamey
(74) Attorney, Agent, or Firm—Wei Te Chung

(57) ABSTRACT

A retainer device (30) for securing a CPU (50) to a socket (10) includes a base (32), a clip (36) pivotably attached to a rear of the base, and a crank (34) pivotably attached to a front of the base. The clip has a frame (362), and a pair of supporting flanges (368) and a pair of pressing tabs (369) depending from the frame. A hook (366) depends from a front of the clip. The crank has an offset pressing lever (344) and an operation rod (346). When the operation rod is rotated down toward the socket, the pressing lever drives the hook downwardly. The supporting flanges abut against the base, and the pressing tabs press the CPU. When a heat sink (20) is attached to the CPU, it slightly depresses the CPU, and the CPU is moved downwardly away from contact with the pressing tabs.

13 Claims, 5 Drawing Sheets

US 6,752,636 B2

RETAINER DEVICE FOR ELECTRONIC PACKAGE

BACKGROUND OF THE INVENTION

1. Field of the Invention

The present invention relates to retainer devices for electronic packages, and particularly to a retainer device which exerts no pressure on an electronic package once a heat sink has been attached to the electronic package.

2. Prior Art

A conventional land grid array (LGA) socket often comprises a retainer device to press a central processing unit (CPU) against the socket in advance. A heat sink is then attached to the CPU by a clamp. Referring to FIG. 6, a conventional retainer device 80 for an LGA socket 86 comprises a rectangular base 81, a crank 82 pivotably attached to one side of the base 81, and a clip 83 pivotably attached to an opposite side of the base 81. The socket 86 is surrounded by the base 81. A CPU 87 is placed on the socket 86. When the clip 83 is rotated downwardly, a distal hook 85 thereof enters a space under an offset pressing lever of the crank 82. The crank 82 is then rotated toward the CPU 87 until the pressing lever of the crank 82 engagingly presses the hook 85. A pair of curve pressing portions 84 is formed at opposite sides of the clip 83, for resiliently pressing the CPU 87.

When a heat sink is attached onto the CPU 87, it depresses the CPU 87 slightly. The pressing portions 84 continue to resiliently exert pressure on the CPU 87. That is, the CPU 87 is subjected to pressure exerted by both the heat sink and the pressing portions 84. The combined pressure is liable to damage the CPU and/or solder balls of the socket that contact an underside of the CPU.

Thus, a retainer device for a socket that can solve the above-mentioned problems is desired.

BRIEF SUMMARY OF THE INVENTION

Accordingly, an object of the present invention is to provide a retainer device which can press an electronic package such as a CPU onto a socket, and which can exert no pressure on the electronic package once a heat sink has been attached to the electronic package.

Another object of the present invention is to provide a retainer device which has simple structure.

To achieve the above-mentioned objects, a retainer device in accordance with a preferred embodiment of the present invention is for securing a CPU to a socket. The retainer device comprises a base, a clip pivotably attached to a rear of the base, and a crank pivotably attached to a front of the base. The clip has a frame, and a pair of supporting flanges and a pair of pressing tabs depending from the frame. A hook depends from a front of the clip. The crank has an offset pressing lever and an operation rod. When the operation rod is rotated down toward the socket, the pressing lever drives the hook downwardly. The supporting flanges abut against the base, and the pressing tabs press the CPU. When a heat sink is attached to the CPU, it slightly depresses the CPU. The supporting flanges maintain the pressing tabs at a same level, and therefore the CPU moves downwardly away from contact with the pressing tabs. No pressure is exerted on the CPU by the pressing tabs.

Other objects, advantages and novel features of the present invention will be drawn from the following detailed description of the preferred embodiment of the present invention with the attached drawings, in which:

DESCRIPTION OF THE PREFERRED EMBODIMENT

Figure 1:
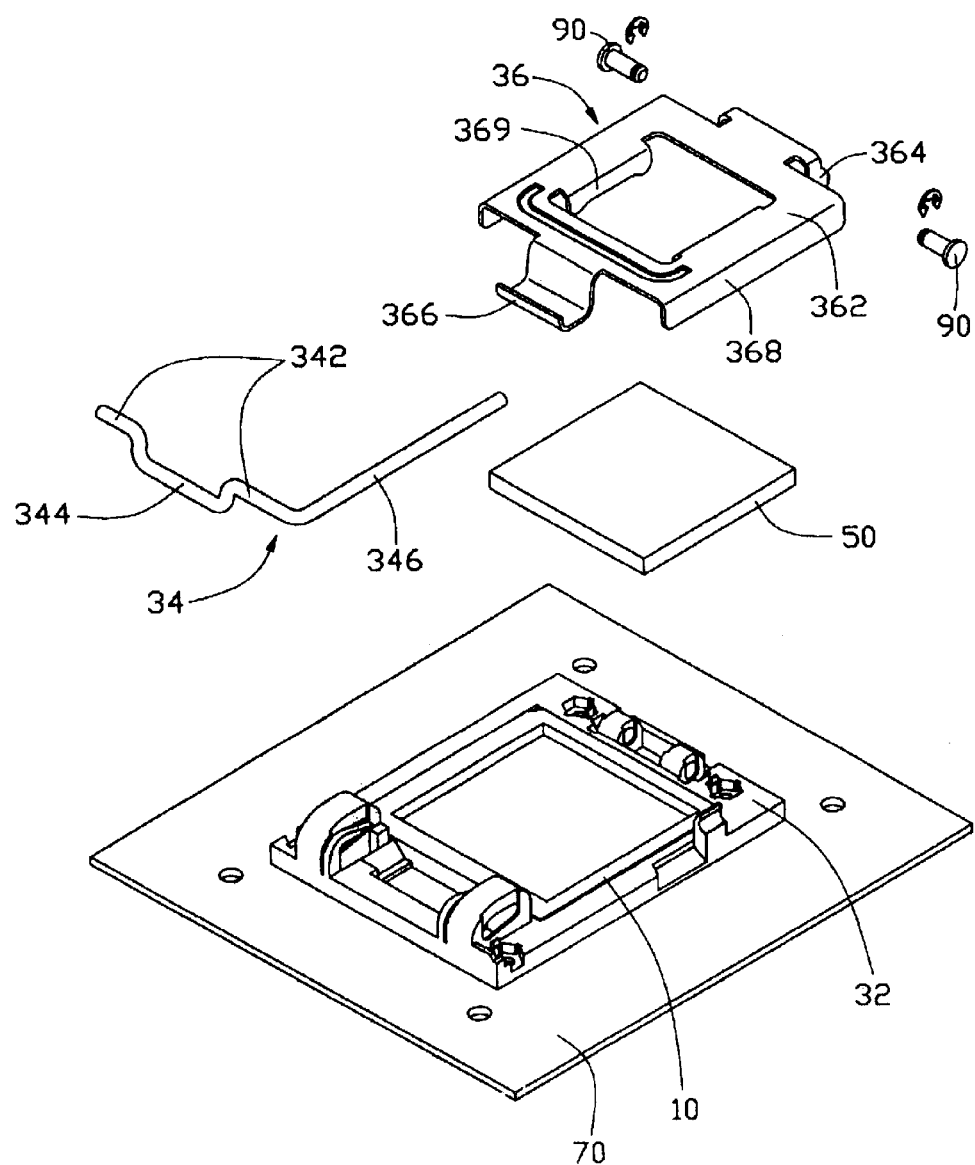
FIG. 1 is an exploded, isometric view of a retainer device in accordance with the present invention, together with a CPU, a CPU socket mounted on a printed circuit board (PCB)
Figure 2:
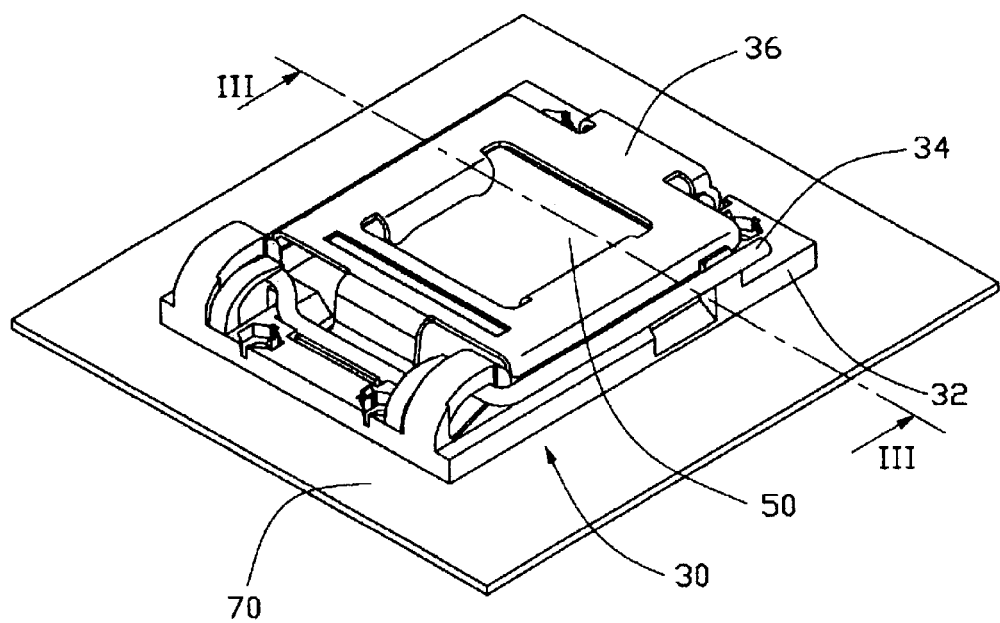
FIG. 2 is an assembled view of FIG. 1.
Figure 3:
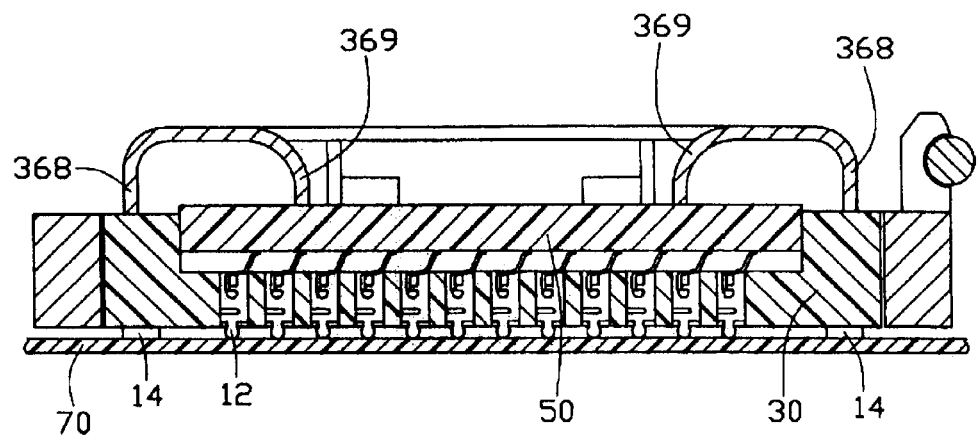
FIG. 3 is an enlarged cross-sectional view taken along line III—III of FIG. 2.

Referring to FIGS. 1–3, a retainer device 30 in accordance with the present invention is used to secure a CPU 50 to a socket 10 secured on a printed circuit board (PCB) 70. The socket 10 comprises a plurality of terminals 12 and a plurality of posts 14. The posts 14 are soldered on the PCB 70.

The retainer device 30 comprises a rectangular base 32, a crank 34 pivotably attached to a rear of the base 32, and a clip 36 pivotably attached to a front of the base 32. The clip 36 is for pressing the CPU 50, and includes a generally rectangular frame 362, a pair of spaced hinge portions 364 formed at a rear of the frame 362, and a hook 366 depending from a front of the frame 362 and then extending outwardly and upwardly. An opening (not labeled) is defined in the middle of the frame 362, for providing access for a heat sink 20 (see FIG. 4). The frame 362 has a pair of supporting flanges 368 depending from respective outer edges of opposite lateral sides thereof, and a pair of pressing tabs 369 depending from respective inner edges of opposite lateral sides thereof at the opening. A height of the supporting flanges 368 is greater than a height of the pressing tabs 369. The hinge portions 364 are pivotably attached to the rear of the base 32 respectively by two pins 90.

The crank 34 includes an offset pressing lever 344, two pivot arms 342 extending from opposite ends of the pressing lever 344 respectively, and an operation rod 346 extending perpendicularly from one end of one of the pivot arms 342. The operation rod 346 facilitates operation of the crank 34.

In pre-assembly, the clip 36 is oriented vertically, and the CPU 50 is put on the socket 10. The operation rod 346 of the crank 34 is oriented horizontally, and is disposed substantially outside the retainer device 30. In this position, the pressing lever 344 of the crank 34 is at a highest location. The clip 36 is then rotated down toward the CPU 50. The hook 366 of the clip 36 thereby enters a space (not labeled) under the pressing lever 344 of the crank 34. Then the operation rod 346 is rotated upwardly and toward the CPU 50 until it reaches a substantially horizontal position alongside the CPU 50, whereupon it is locked by a locking portion (not labeled) of the base 32. The pressing lever 346 of the crank 34 is at a lowest location, and drives the hook 366 downwardly. The supporting flanges 368 of the clip 36 abut against the base 32, and the pressing tabs 369 press against the CPU 50 (see FIG. 3). The clip 36 thereby securely attaches the CPU 50 to the socket 10.

Figure 4:
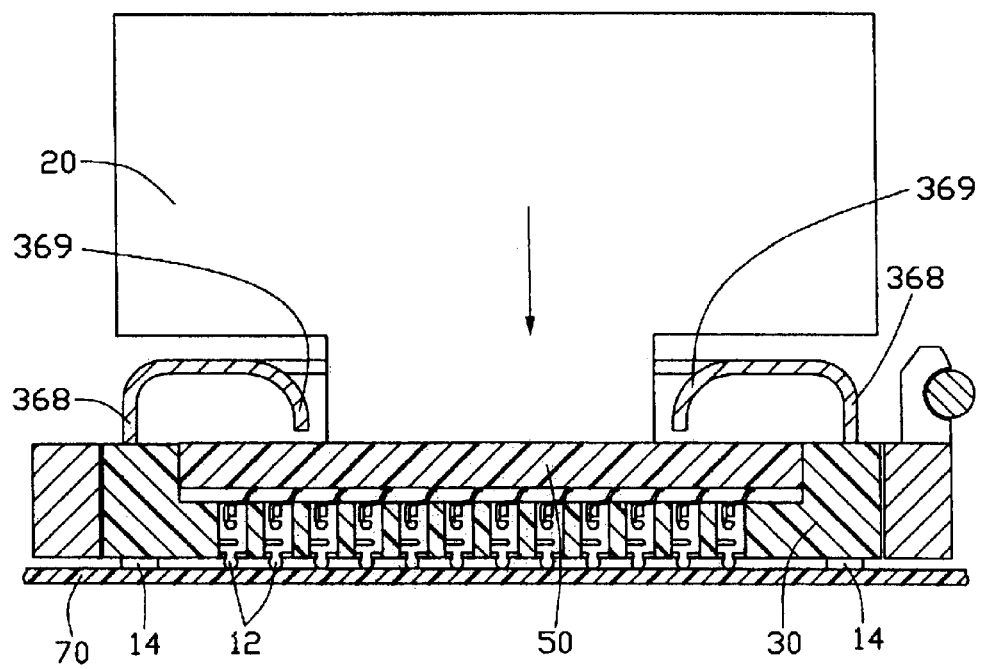
FIG. 4 is similar to FIG. 3, but showing a heat sink attached to a top surface of the CPU.
Figure 5:
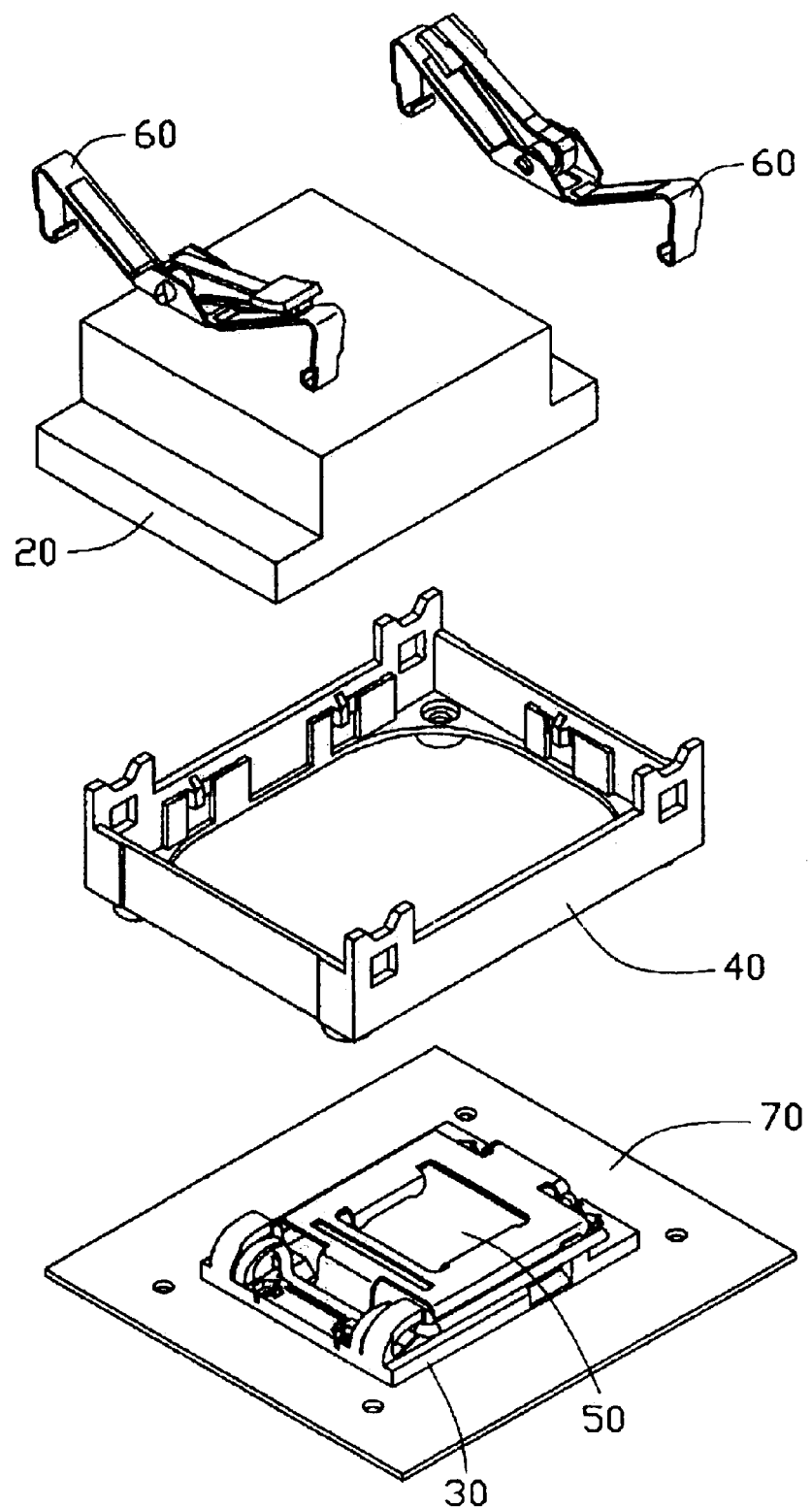
FIG. 5 is an exploded isometric view of the assembly as seen in FIG. 2, together with a retention module, a heat sink and a pair of clamps.
Figure 6:
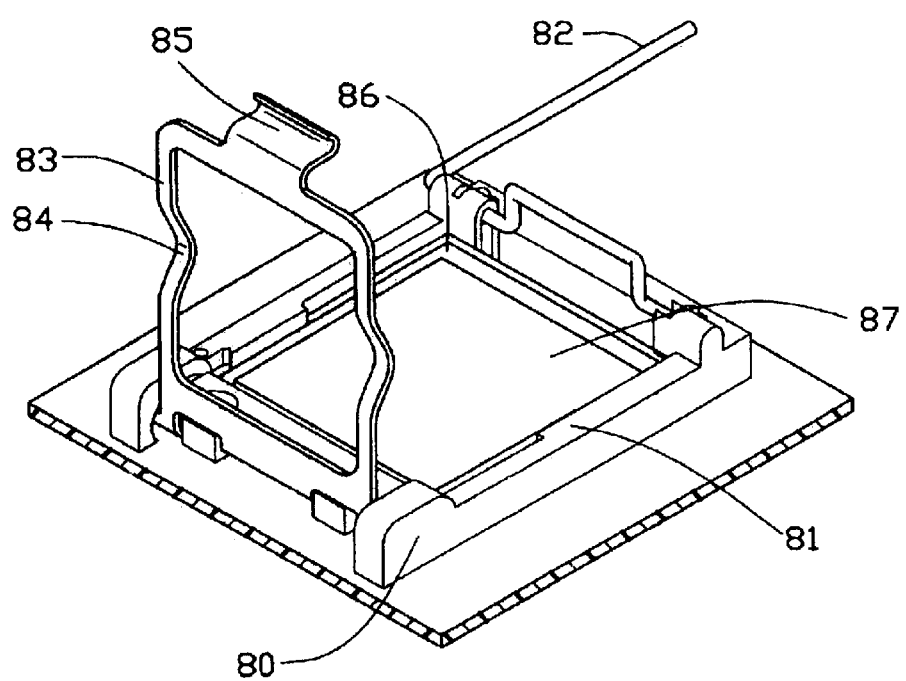
FIG. 6 is an isometric view of a conventional retainer device mounted on an LGA socket on a PCB, with a CPU received in the LGA socket.

Referring also to FIGS. 4 and 5, in assembly, the heat sink 20 is placed onto the CPU 50. A pair of clamps 60 is placed on a base portion of the heat sink 20. The clamps 60 are engaged with a retention module 40 that is mounted on the PCB 70, and thereby securely attaches the heat sink 20 to the CPU 50. As a result, the heat sink 20 depresses the CPU 50 slightly. The supporting flanges 368 of the clip 36 maintain the pressing tabs 369 at a same level, and therefore the CPU 50 moves downwardly away from contact with the pressing tabs 369. No pressure is exerted on the CPU 50 by the pressing tabs 369.

In the present invention, the supporting flanges 368 of the clip 36 act as stoppers, preventing the pressing tabs 369 from exerting force on the CPU 50 after assembly. This protects the CPU 50 and the socket 10 from being damaged.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A retainer device for fastening an electronic package to a socket mounted on a circuit board, the retainer device comprising:
    a base adapted for attachment to the circuit board whereby the base substantially surrounds the socket;
    a clip pivotably attached to one side of the base, the clip comprising a fastening portion at an end thereof, and further comprising at least one flange and at least one pressing portion extending therefrom, the at least one flange adapted to abut against the base, the at least one pressing portion adapted to press the electronic package; and
    a fastening device pivotably attached to the base, the fastening device driving the fastening portion of the clip whereby the clip attaches the electronic package to the socket; wherein
        when a heat sink is attached to the electronic package, the electronic package is depressed, and the at least one pressing portion does not contact the electronic package.

2. The retention device as described in claim 1, wherein a height of the at least one flange is greater than a height of the at least one pressing portion.

3. The retention device as described in claim 1, wherein the clip comprises a frame, two flanges extending from respective outer edges of opposite sides of the frame, and two pressing portions depending from respective inner edges of the opposite sides of the frame.

4. The retention device as described in claim 1, wherein the fastening device is a crank, and the crank comprises an offset pressing lever and an operation portion.

5. The retention device as described in claim 4, wherein the fastening portion of the clip is a hook, and the offset pressing lever of the crank drives the hook.

6. The retention device as described in claim 1, wherein the clip is pivotably attached to said one side of the base by at least one pin.

7. An electronic connector assembly, comprising:
    a circuit board;
    a socket mounted on the circuit board;
    an electronic package attached on the socket; and
    a retainer device attached on the circuit board and securing the electronic package on the socket, the retainer device comprising a base surrounding the socket and a clip engaging with the base, the clip comprising at least one flange and at least one pressing portion extending therefrom, wherein the at least one flange abuts against the base, and the at least one pressing portion presses the electronic package; and
    when a heat sink is attached to the electronic package, the electronic package is depressed downwardly by the hear sink and released from the pressure exerted thereon by the pressing portion of the clip.

8. The electronic connector assembly as described in claim 7, wherein a height of the at least one flange is greater than a height of the at least one pressing portion.

9. The electronic connector assembly as described in claim 7, wherein the clip is pivotably attached to one side of the base, and a hook is arranged at one end of the clip.

10. The electronic connector assembly as described in claim 9, wherein the retainer device further comprises a crank pivotably attached to an opposite side of the base, the crank driving the hook of the clip.

11. The electronic connector assembly as described in claim 10, wherein the crank comprises an offset lever driving the hook, and an operation portion to facilitate manual operation.

12. An electronic connector assembly comprising:
    a printed circuit board;
    an electronic package assembly located on the printed circuit board;
    a retainer device mounted on the printed circuit board and including:
        a base surrounding said electronic package assembly; and
        a clip pivotally mounted to the base and including a pressing tab and a flange;
    said electronic package assembly being moveable vertically between upper and lower positions; wherein
        when the electronic package assembly is in the upper position, the pressing tab abuts against said electronic package; when the electronic package assembly is in the lower position, the pressing tab Is vertically spaced from the electronic package assembly while the flange abuts against the base.

13. The assembly as described in claim 12, further including a heat sink downwardly abutting against the electronic package assembly to urge said electronic package assembly to be in said lower position.

* * * * *